United States Patent [19]

Hänseler et al.

[11] Patent Number: 4,525,771
[45] Date of Patent: Jun. 25, 1985

[54] CIRCUIT BOARD MODULE MOUNTING UNIT

[75] Inventors: Urs Hänseler, Pfaffhausen; Urs Meier, Bassersdorf; Franz Muther, Zürich, all of Switzerland

[73] Assignee: Contraves AG, Zurich, Switzerland

[21] Appl. No.: 533,662

[22] Filed: Sep. 19, 1983

[30] Foreign Application Priority Data

Sep. 30, 1982 [CH] Switzerland ............ 5777/82

[51] Int. Cl.³ .............................................. H05K 7/18
[52] U.S. Cl. ..................... 361/413; 211/41; 339/17 LM; 361/415
[58] Field of Search .............. 361/412, 413, 415, 429, 361/395, 399; 211/41; 339/17 M, 17 LM, 65, 66 R

[56] References Cited

U.S. PATENT DOCUMENTS

| 3,197,731 | 7/1965 | Beale et al. | 361/415 |
| 3,347,608 | 10/1967 | Ritchie | 317/101 |
| 3,360,689 | 12/1967 | Haury | 339/17 LM |
| 3,699,396 | 10/1972 | Colaud et al. | 317/101 |
| 3,939,382 | 2/1976 | Lacan et al. | 317/101 |
| 4,328,847 | 5/1982 | Weiss | 361/415 |
| 4,429,937 | 2/1984 | Stockmaster | 361/415 |

FOREIGN PATENT DOCUMENTS 1197151 7/1965 Fed. Rep. of Germany .
2007303 9/1970 Fed. Rep. of Germany .
2119709 11/1972 Fed. Rep. of Germany .
2556225 6/1977 Fed. Rep. of Germany .

OTHER PUBLICATIONS

IBM Tech. Discl. Bull., vol. 14, No. 9, Feb. 1972, Card Retention Scheme, Johnson, p. 2671.

Primary Examiner—G. P. Tolin
Attorney, Agent, or Firm—Werner W. Kleeman

[57] ABSTRACT

A modular assembly comprising a rack composed of side walls, two front and at least two rear transverse support members for the accommodation of one-tier or two-tier module supports. For the accommodation of the module supports which comprise at least one connector there are provided guide rails which are releasably attached to the transverse support members by means of resilient latching members. The guide rails each comprise securing means for attaching a connector by means of a plug. For securing two connectors there is provided in addition to the securing means of the guide rails a snap-on holder releasably attached to an intermediate transverse support member. When assembled the support elements of the individual module supports which are provided with a nose are in engagement with a longitudinal groove in the front transverse support member while the module supports are secured to the rack by means of a securing member which is provided with shock-absorbing profiled sectional members lying in contact with the support elements.

9 Claims, 7 Drawing Figures

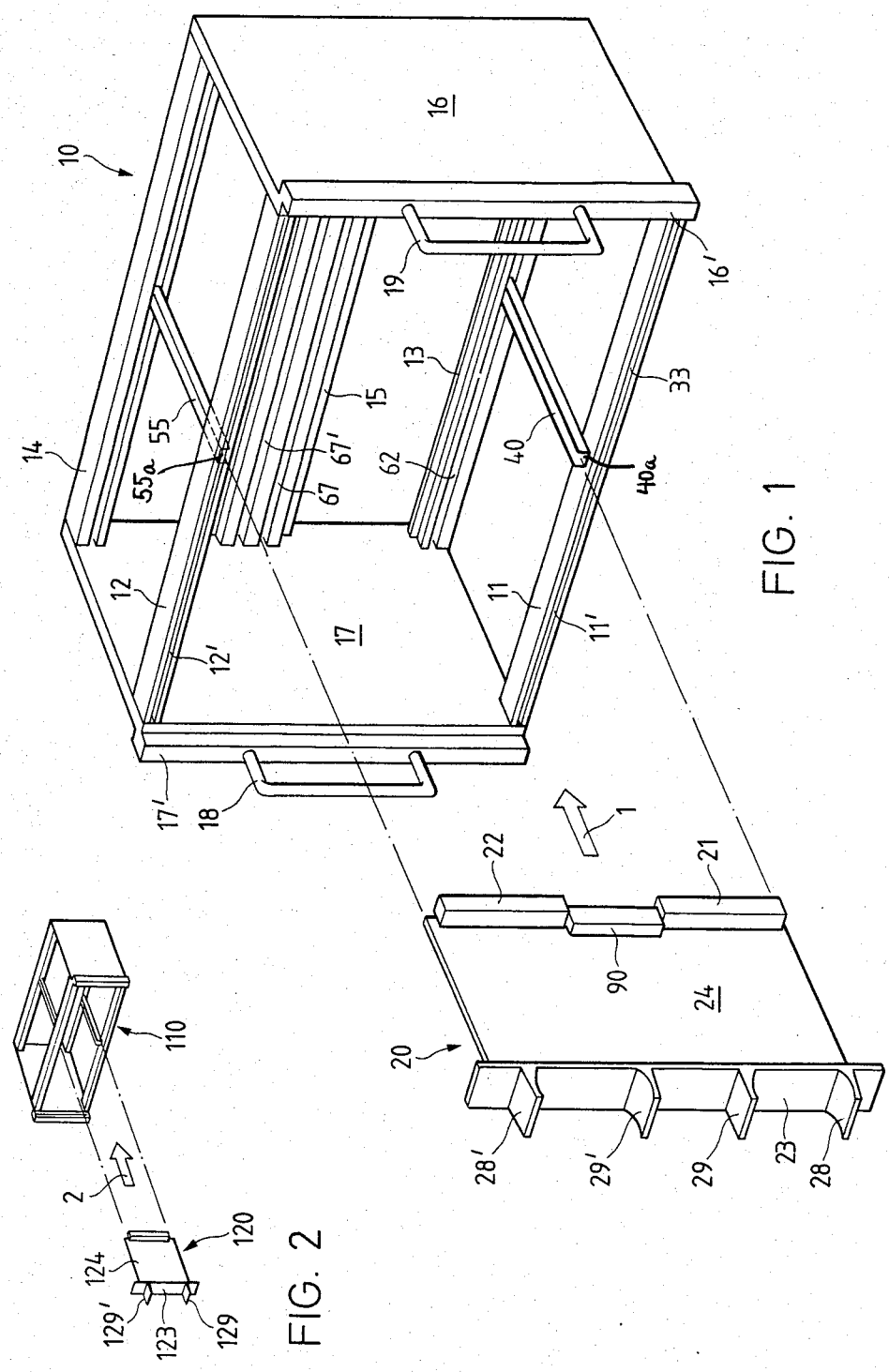

FIG. 5
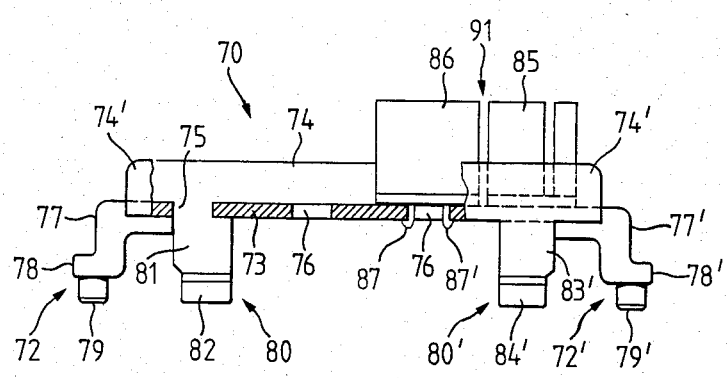
FIG. 6
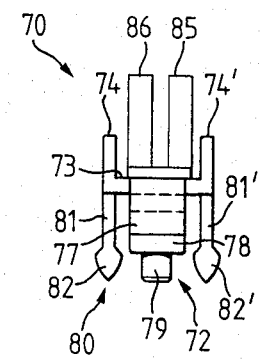
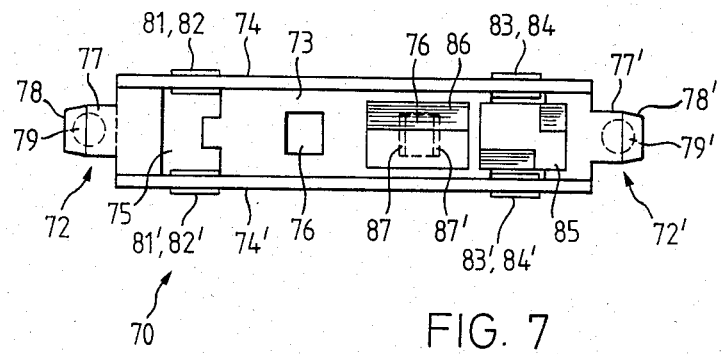
FIG. 7

CIRCUIT BOARD MODULE MOUNTING UNIT

CROSS-REFERENCE TO RELATED APPLICATION

This application is related to our commonly assigned, copending U.S. application Ser. No. 06/533,662, filed Sept. 19, 1983, and entitled "GUIDE RAIL FOR ELECTRONIC MODULE SUPPORTS", the disclosure of which is incorporated herein by reference.

BACKGROUND OF THE INVENTION

The present invention is concerned with an improved modular assembly, consisting of a rack or support frame with two side walls, two front transverse support members and two rear transverse support members and at least one guide unit having a pair of guide rails latchably attachable to the transverse support members as well as a module support with connectors for electrical connection with corresponding connectors provided on the rear transverse support members.

From German Published Patent Specification No. 2,007,303, published Sept. 10, 1970, there is known a modular assembly with a rack of the above type. In such modular assembly there is provided a multiplicity of spaced apart threaded holes on the rear support members for the purpose of fastening spaced-apart connectors. The connectors, which are intended for electrical connection with insertable module supports are attached to the support members with screws, which serve simultaneously for the attachment of the rear ends of the lower and upper guide rails to the support members. At their front ends the guide rails are provided with noses, which snap into corresponding holes in additional upper and lower metal strips. Provision of the threaded holes in the support members is expensive having regard to the close tolerances required and to the substantial labor costs for the assembly and attachment of the connectors.

If, for example, a connector is to be replaced, it is necessary in the known rack to loosen and remove the corresponding screws. It can also happen quite easily with this modular assembly that during operational use a screw could work itself loose because of constant vibration and fall between the other module supports and cause a short-circuit or become lost.

SUMMARY OF THE INVENTION

Therefore, with the foregoing in mind it is a primary object of the present invention to provide a new and improved construction of modular assembly or the like which is not afflicted with the aforementioned shortcomings and drawbacks of the prior art constructions.

It is another more specific object of the present invention to provide, on the one hand, an assembly and attachment without screws or the like which is simple in design and in manufacture, of the guide rails and connectors to the support members, and, on the other hand, to accommodate the module supports, which are provided with support elements, and which have been inserted into the rack, in vibration-free manner and forming a rugged unit with the rack, without particular expense and with simple means.

According to the present invention these objects and others which will become more readily apparent as the description proceeds, are achieved in that (a) the guide rails which are latchably attached at their front and rear ends to the transverse support members for holding the connectors have at their rear ends a securing member;

(b) for the stabilization of the modular assembly there is provided at the upper and lower ends of the support elements a nose, which in the inserted condition of the modular or module support engages in a groove provided in the front transverse support members;

(c) for the fastening of the individual module supports in the rack a retaining or securing member is provided having elastic shock-absorbing profiled parts and engaging with the front surface of the support element.

In a modular assembly with a rack which has a third transverse support member between the two rear transverse support members, and which is intended to accommodate and electrically connect two-tier module supports having two connectors, there is provided, according to a further feature of the present invention, a snap-on holder for fastening two connectors to two corresponding connectors in the rack, the snap-on holder being latchably fastened to the third transverse support member.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 is a perspective front view of a rack or support frame in two-tier configuration with a module support for electronic elements which has been partially withdrawn;

FIG. 2 is the rack according to FIG. 1 in single tier configuration with a correspondingly adapted single-section or single-tier module support, also withdrawn from the rack;

FIG. 5 is a side elevation of a snap-on holder for connectors to be fastened in the rack;

FIG. 6 is the snap-on holder of FIG. 5 in end elevation; and

FIG. 7 is a top plan view of the snap-on holder of FIGS. 5 and 6.

BRIEF DESCRIPTION OF THE PREFERRED EMBODIMENTS

Figure 3:
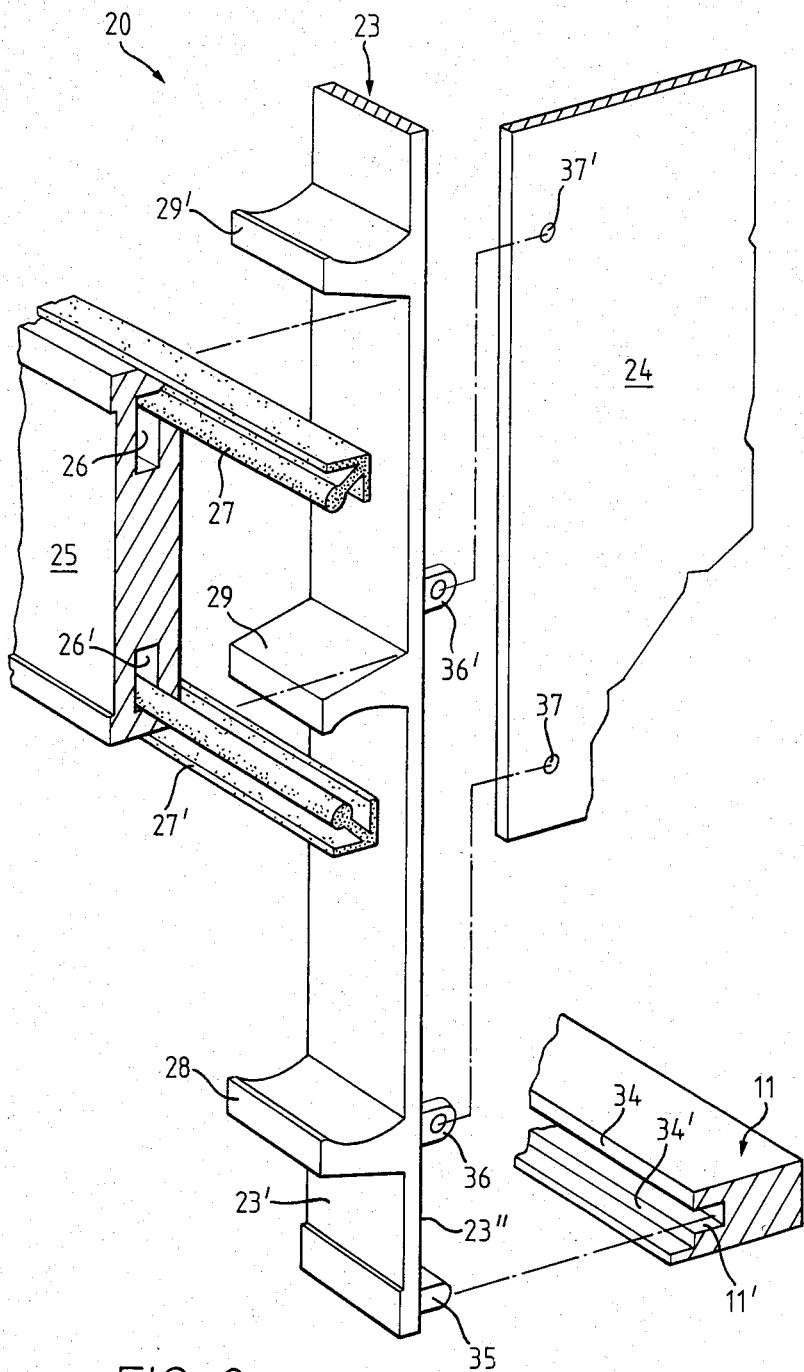
FIG. 3 is a perspective sectional view, to an enlarged scale, of the front side of the rack and of the module support system in disassembled condition.

In FIG. 1 a rack or support frame is generally indicated by the reference numeral 10 which is constructed for the accommodation and attachment and electrical connection of two-tier module supports 20.

The rack 10 is provided on its front side with a lower and an upper transverse support member 11 and 12 and on its rear side with a lower and an upper transverse support member 13 and 14. In the substantially open rear side of the rack 10 shown in FIG. 1 there is provided an additional intermediate transverse support member 15. The transverse support members 11, 12, 13, 14 and 15 are attached to the side walls 16, 17 by suitable means, not shown. The parts 11, 12, 13, 14, 15, 16 and 17 together form a rugged box-like constructional unit.

On the facing side of the rack or support frame 10 there are provided on the two side walls 16, 17, handles 18, 19, attached by suitable means, not shown.

To assist insertion and fastening of the individual module supports 20 the fully assembled rack 10 is provided with respective guide rails 40 and 55 disposed adjacent to one another on the transverse support members 11, 12, 13 and 14. In FIG. 1 there is shown for the sake of clarity only one corresponding pair of guide rails 40, 55 for the module support 20 which can be inserted into the rack 10 in the direction of the arrow 1.

The module support 20, which, as shown in FIG. 1, has not yet been inserted into the rack 10, comprises a printed circuit board 24, and first and second connectors 21, 22 disposed on a longer rear edge of such printed circuit board 24, the connecting prongs or pins not being illustrated. There is also provided on the front edge of the printed circuit board 24 a support element 23 attached by means, not shown in FIG. 1 in any detail, and which is formed as a sort of slat or ledge-like member. The printed circuit board 24 is intended for the accommodation and electrical connection of electronic elements, not shown.

FIG. 2 shows as a variant a rack or support frame 110 which is adapted for the accommodation and electrical connection of single-tier module supports 120 which may be inserted in the direction of the arrow 2. The construction of the rack 110 as well as of the module support 120 comprising the parts 123, 124, 129, 129' corresponds essentially to the rack 10 according to FIG. 1, where in the variant according to FIG. 2 only the height of the module support and of the rack are smaller and thus the intermediate transverse support member 15 at the rear side is not necessary.

In FIG. 3 there is shown a perspective sectional view, to an enlarged scale, of the facing or exposed front side constructional system with the module support 20 illustrated in dismantled condition and the lower transverse support member 11 of the rack 10. The transverse support member 11 is provided on the side facing the support element 23 with two mutually corresponding abutment or impact surfaces 34, 34' as well as a longitudinal groove 11'. The upper transverse support member 12, not shown in FIG. 3, of the rack 10 (see FIG. 1) is similarly shaped as the lower transverse support member 11 and is provided with a groove 12'.

Further there is shown in FIG. 3 the printed circuit board 24 of the module support 20. The printed circuit board is provided with spaced apart holes 37, 37' and is attached by any suitable fastening means, not shown, to lugs or projections 36, 36' of the support element 23. The parts 21, 22, 23 and 24 constitute the module support 20 (FIG. 1) which as a constructional unit may be inserted as shown by the arrow 1 of FIG. 1, into the rack 10 by means of handles 28, 28', 29, 29' or equivalent structure disposed on the facing or front side 23' of the support element 23. In the inserted condition of each individual module support 20 the printed circuit board 24 is guided in the related guide rails 40, 55 and the support element 23 rests firmly at its lower end against the abutment surfaces 34, 34' of the lower transverse support member 11 and at its upper end against comparable abutment surfaces, not shown, of the upper transverse support member 12. In order to achieve optimal positioning and stability the support element 23 is provided on its back surface 23" with a nose or nose member 35 which is inserted into the groove 11' of the transverse support member 11, and at the upper end of the support element 23 there is also provided a similar nose or nose member, not shown, which cooperates with the corresponding groove 12' of the upper transverse support member 12.

For securing the individual module supports 20 which have been inserted into the rack 10 there is provided a rail-like securing or retaining member 25. This securing or retaining member 25 is provided for the purpose of elastic shock-absorbing fastening on the side facing the support element 23 with two elastic profiled sectional members or parts 27, 27' accommodated and held in grooves 26, 26', extending along the length of the securing or retaining member 25. The securing member 25 with the two profiled sectional members 27, 27' can be fitted between the two handles 29, 29' according to the chain dotted lines and extends over the whole width of the rack 10 and is releasably fastened with any suitable means, not shown, to the facing or front edges 16', 17' of the side walls 16, 17 of the rack 10 (see FIG. 1). The securing or retaining member 25 with its profiled sectional members 27, 27' provides an elastic shock-absorbing, militarily-sound fastening of the module supports 20 and 120 in the racks 10 and 110, respectively.

It should be here mentioned that in the single-tier rack or support frame 110 shown in FIG. 2, the support element 123 of the module support 120 has only two handles 129, 129', between which a securing or retaining member, not shown, and built like the securing or retaining member 25, can be inserted for fastening the various module supports 120.

Figure 4:
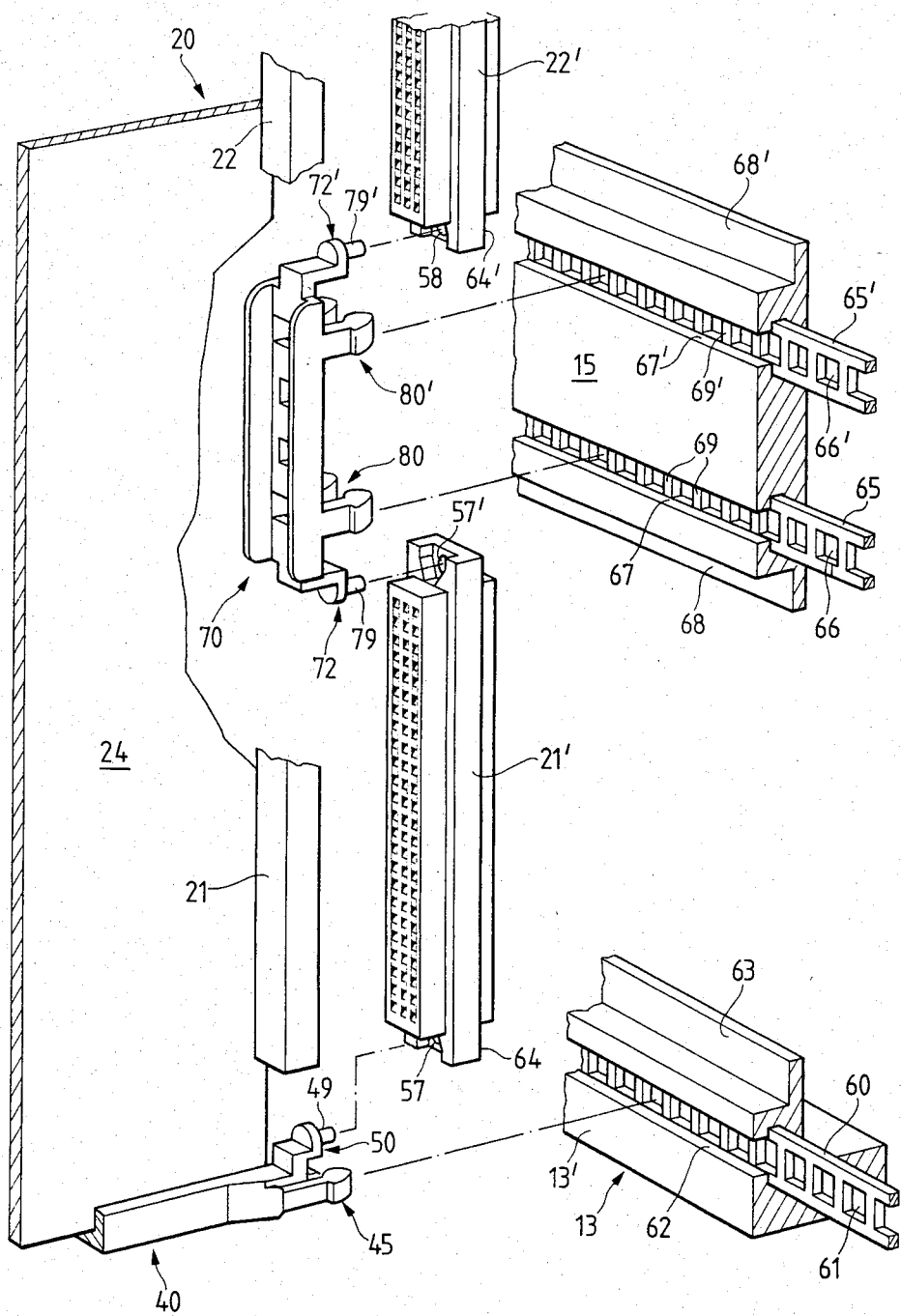
FIG. 4 is a perspective sectional view, to an enlarged scale, of the rear side of the rack and module support system in disassembled condition.

In FIG. 4 there is shown, to an enlarged scale, a perspective sectional view of the rear constructional system with a module support 20 in dismantled condition and there can be seen the printed circuit board 24, the guide rail 40, a portion of the connectors 21, 22 as well as the lower rear transverse support member 13 of the rack 10. This lower rear transverse support member 13 comprises on the side 13' facing the module support 20 a longitudinal groove 62 and an abutment or impact surface 63 set back in relation to the side 13'. A metal strip 60 is inserted into the groove 62 and is prevented from falling out by the shape of the groove 62, and such metal strip 60 is provided with a multiplicity of spaced apart holes or apertures 61, which penetrate the metal strip 60.

The upper transverse support member 14 of the rack 10 of FIG. 1, but not shown in FIG. 4, is shaped like the lower transverse support member 13 and is also provided with a metal strip, not shown, which is like the metal strip 60 and mounted in the same way.

Further there may be seen in FIG. 4 the intermediate transverse support member 15 disposed at a distance from the lower transverse support member 13 as well as two connectors or sockets 21', 22' which are mounted corresponding to the plug-like connectors 21, 22 disposed on the printed circuit board 24 of the module support 20. The connectors 21', 22' are secured in the assembled condition to the lower and upper transverse support members 13 and 14, on the one hand by means of a boss or plug-like member 49 of securing means 50 provided at the rear ends of the lower and upper guide rails 40 and 55 and shown schematically in FIG. 4. On the other hand, they are held to the intermediate transverse member 15 by means of an additional snap-in or pluggable holder or holder member 70.

The intermediate transverse support member 15 disposed between the lower and upper transverse support members 13, 14 is provided on its side facing the module support 20 with two spaced apart longitudinal grooves 67, 67' as well as with two abutment or contact surfaces 68, 68'. Into each groove 67, 67' there is inserted a metal strip 65, 65' which is secured against falling out by the cross-section of the related groove 67, 67'. Each metal strip 65, 65' is provided with a multiplicity of holes or apertures 66, 66' which are separated by cross-pieces 69, 69'.

In FIGS. 5, 6 and 7 there is shown the snap-in or pluggable holder 70, which will now be described in detail.

FIG. 5 shows a part sectional elevation of the snap-in or pluggable holder 70 which comprises a substantially U-shaped cross-section, consisting of the side walls 74, 74' and a base 73. At each end of the snap-in holder 70 there is provided a fastening member 72, 72' extending downwardly at an angle, and between the two fastening members 72, 72' there are formed two spaced-apart and downwardly projecting latching or snap-connector members 80, 80'. In the base 73 there are spaced-apart apertures or recesses 75, 76 which are intended to accommodate coding parts. In FIG. 5 there are shown by way of example schematically only two coding parts 85, 86 which are held in place by means of latching prongs 87, 87' which latch resiliently into the apertures 75, 76 and grip the underside of the base 73.

The first fastening member 72, formed as an extension of the base 73, comprises a plug 79, a first arm or web 78 disposed parallel to the base 73 as well as a second arm or web 77 formed on the base 73. The second fastening member 72' is similarly shaped to the first fastening member 72 and comprises the parts 79', 78' and 77'. The first latching member 80 comprises two arms 81, 81' formed on the side walls 74, 74' which are resilient transversely to the length of the snap-on holder 70 as well as two latching tenons or projections 82, 82'. The second latching member 80' is similarly formed and comprises the parts 83, 83' and 84, 84'.

In FIG. 6 there is shown an end elevation of the snap-on holder consisting of the side walls 74, 74' and the base 73 having a U-shaped cross-section and the first fastening member 72 made up of the parts 79, 78 and 77, the first latching member 80 comprising the parts 81, 81' and 82, 83' as well as the coding parts 85, 86 disposed between the side walls 74, 74' and latched into the base 73.

In FIG. 7 the snap-on holder 70 is shown in plan, and there may be seen the fastening members 72, 72' provided at opposite ends, the parts 81, 81', 82, 82', 83, 83' and 84, 84' of the two latching members 80, 80', the spaced-apart apertures or recesses 75, 76 as well as the two coding parts 85, 86 of a second coding element 91.

In the following the assembly of the two-tier rack will be described by way of example.

Starting with the rack 10 shown in FIG. 1 and consisting of the parts 11, 12, 13, 14, 15, 16 and 17, the two connectors, or sockets 21', 22' are first inserted, and are removably held in place essentially by means of the snap-on holder 70 on the intermediate transverse support member or ledge 15, by means of the guide rail 40 on the lower transverse support member or ledge 13 and by means of the guide rail 55 on the upper transverse support member 14.

In order to secure the two connectors 21', 22' as shown in FIG. 4 by the chain-dotted lines, the snap-on holder 70 which is provided with the latching members 80, 80' is first brought into engagement with the two metal strips 65, 65' of the transverse support member 15. Secondly, the latching member 45, schematically illustrated, and disposed at the end of the guide rail 40, is brought into engagement with the metal strip 60 of the lower transverse support member 13, and thirdly, the latching member, not shown, of the upper guide rail 55 is brought into engagement with the metal strip, not shown, of the upper transverse support member 14. As a result of this the two plugs 79, 79' of the fastening members 72, 72' penetrate the holes 57', 58 of the connectors 21', 22' which are correspondingly adapted and arranged, and the dart or drop-like latching tenons 82, 82' and 84, 84' of the latching members 80, 80' are pressed into the apertures or recesses 66, 66' of the metal strips 65, 65'. In the final position the resiliently formed latching tenons 82, 82' and 84, 84' are engagingly latched behind the cross-pieces 69, 69' of the metal strips 65, 65' and the connectors 21', 22' are firmly pressed against the abutment or contact surfaces 68, 68' of the intermediate transverse support member 15 with their projections 65, 64'.

Attachment of the connectors 21', 22' in the lower and upper region of the rack 10 by means of the latching members 45 of the guide rails 40, 55 on the rear transverse support members 13, 14 is essentially the same as the above described fastening of the snap-on holder 70 on the intermediate transverse support member 15. For the attachment of the two guide rails 40, 55, to the front transverse support members 11, 12 there are provided in the front region of the guide rails correspondingly shaped latching members, not shown.

As an aid to introduce the module support 20 into the rack 10 there is provided in the guide rails 40, 55 a groove 40a, 55a, and in each such groove there is at least one resilient element, not shown, for guiding the printed circuit board 24. The grooves and resilient elements of the guide rails 40, 55 allow exact joining of the connectors 21, 21' and 22, 22'.

In FIG. 1 there is provided on the module support 20 between the two connectors 21, 22 a schematically shown coding element 90 fastened in place. In the assembled condition the first coding element 90 is in effective contact with a second coding element 91, not shown in FIG. 1 but depicted in FIGS. 5 to 7. The second coding element 91 comprises several coding parts 85, 86 mounted on the snap-on holder 70 and arranged in a row. With the two coding elements 90, 91 wrong insertions of module supports 20 provided with different modules are avoided and thereby joining and deformation of connectors which do not belong together is also prevented.

While there are shown and described present preferred embodiments of the invention, it is to be distinctly understood that the invention is not limited thereto, but may be otherwise variously embodied and practiced within the scope of the following claims. Accordingly,

What we claim is:

1. A circuit board module mounting unit, comprising:
    a rack containing two side walls, two front transverse support members and at least two rear transverse support members;
    at least one pair of guide rails latchably attached to said transverse support members and defining at least one guide unit;

at least one connector member cooperating with at least one of said rear transverse support members;

at least one module support having at least one connector in electrical connection with said connector member;

each of said guide rails having a rear end;

securing means including plug means provided on the rear end of at least one of said guide rails and securing said connector member to said at least one rear transverse support member;

at least one of said front transverse support members being provided with groove means;

said module support comprising at least one support element having an upper end and lower end;

a nose member provided on at least one of said ends of the support element, which nose member engages with said groove means of said at least one front transverse support member for the stabilization of the modular assembly; and a securing member having at least two predominantly longitudinal elastic shock-absorbing profiled sectional members mounted in mutually laterally spaced relationship on a front surface of the support element and securing each said module support in the rack.

2. The circuit board module mounting unit as defined in claim 1, wherein:

said rack is structured to accommodate and electrically connect two-tier module supports having connectors;

a third rear transverse support member provided between the two rear transverse support members; and a snap-on holder latchingly engaging with the third rear transverse support member for the purpose of securing two of said connector members, corresponding to two said connectors on the module support, to said third rear transverse support member.

3. The circuit board module mounting unit as defined in claim 2, wherein:

said snap-on holder has a substantially U-shaped cross-section comprising protruding fastening members provided with plugs and oppositely disposed latching members provided with latching tenons; and said oppositely disposed latching members are resiliently formed transversely to their length.

4. The circuit board module mounting unit as defined in claim 3, wherein:

said fastening members and said latching members are downwardly oriented.

5. The circuit board module mounting unit as defined in claim 2, wherein:

said module support comprises a printed circuit board having a rear side; and a first coding element provided at the rear side of said printed circuit board;

a second coding element provided on the snap-on holder; and said first and second coding elements cooperating with one another in order to avoid wrong insertion of said module support.

6. The circuit board module mounting unit as defined in claim 5, wherein:

said snap-on holder is provided with a base;

said second coding element being provided with resilient latching prongs; and said base being provided with a plurality of spaced-apart apertures for latching attachment of the second coding element by means of said resilient latching prongs.

7. The circuit board module mounting unit as defined in claim 1, further including:

securing means including plug means provided on the rear end of the other one of said guide rails for securing said other guide rail to the other one of said rear transverse support members.

8. The circuit board module mounting unit as defined in claim 1, wherein:

the other one of said front transverse support members is provided with groove means;

a further nose member provided on the other end of the support element, which nose member engages with said groove means of said other front transverse support member for the stabilization of the modular assembly.

9. A circuit board module mounting unit, comprising:

a rack containing two side walls, two front transverse support members and two rear transverse support members;

at least one guide rail latchably attached to predetermined ones of said transverse support members and defining at least one guide unit;

at least one connector member;

at least one module support having at least one connector for electrical connection with said connector member;

a plug member integrally formed with said guide rail and defining securing means securing said connector member to one of said rear transverse support members;

at least one of said front transverse support members being provided with groove means facing away from said at least one connector member;

said module support comprising at least one support element having an upper end and lower end;

a nose member provided in at least one of said ends of the support element, which nose member protrudes from said support element toward said connector member and extends in a direction substantially transverse to said at least one module support and its support element and engages with said groove means of said at least one front transverse support member in the lateral stabilization of the at least one module support and its support element;

a securing member cooperating with the support element and securing said module support in the rack;

said securing member being provided with longitudinally extending grooves at edge regions thereof; and substantially longitudinal resilient profiled section members engaging said longitudinally extending grooves and bearing against an outer face of said support element and inhibiting lateral motion thereof as well as selectively preventing ejection thereof from the circuit board module mounting unit.

* * * * *

UNITED STATES PATENT AND TRADEMARK OFFICE
CERTIFICATE OF CORRECTION

PATENT NO. : 4,525,771
DATED : Jan 25, 1985
INVENTOR(S) : Hänseler et al

It is certified that error appears in the above—identified patent and that said Letters Patent is hereby corrected as shown below:

Column 1, line 7, please delete "06/533,662" and insert --06/533,663--

Signed and Sealed this

Eighth Day of October 1985

[SEAL]

*Attest:*

*Attesting Officer*

DONALD J. QUIGG

*Commissioner of Patents and Trademarks—Designate*